(12) United States Patent
Gao et al.

(10) Patent No.: US 9,040,833 B2
(45) Date of Patent: May 26, 2015

(54) CAPACITIVE TRANSPARENT CONDUCTIVE FILM AND PREPARATION METHOD THEREOF

(71) Applicant: NANCHANG O-FILM TECH. CO., LTD., Nanchang, Jiangxi (CN)

(72) Inventors: Yulong Gao, Nanchang (CN); Ying Gu, Nanchang (CN); Yunhua Zhao, Nanchang (CN); Guanglong Xie, Nanchang (CN)

(73) Assignee: NANCHANG O-FILM TECH. CO., LTD., Jiangxi (CN)

( * ) Notice: Subject to any disclaimer, the term of this patent is extended or adjusted under 35 U.S.C. 154(b) by 144 days.

(21) Appl. No.: 14/000,200

(22) PCT Filed: Jul. 5, 2013

(86) PCT No.: PCT/CN2013/078909
§ 371 (c)(1),
(2) Date: Aug. 16, 2013

(87) PCT Pub. No.: WO2014/153895
PCT Pub. Date: Oct. 2, 2014

(65) Prior Publication Data
US 2015/0000962 A1    Jan. 1, 2015

(30) Foreign Application Priority Data

Mar. 28, 2013  (CN) .............................. 201310105112

(51) Int. Cl.
| H05K 3/00 | (2006.01) |
| H05K 1/02 | (2006.01) |
| G06F 3/044 | (2006.01) |
| H05K 1/03 | (2006.01) |
| H05K 1/09 | (2006.01) |
| H05K 3/02 | (2006.01) |

(52) U.S. Cl.
CPC .............. *H05K 1/0274* (2013.01); *G06F 3/044* (2013.01); *H05K 1/0298* (2013.01); *H05K 1/0353* (2013.01); *H05K 1/09* (2013.01); *H05K 3/02* (2013.01); *H05K 2201/09036* (2013.01)

(58) Field of Classification Search
CPC ........... H05K 3/00; G06F 3/041; G06F 3/044; G06F 3/045; B32B 27/00; B32B 7/02; B32B 7/12
USPC .......... 174/253, 250, 255, 389; 345/173, 174; 216/13; 313/498
See application file for complete search history.

(56) References Cited

U.S. PATENT DOCUMENTS

2010/0182275 A1* 7/2010 Saitou .......................... 345/174
2010/0231554 A1* 9/2010 Anno et al. ................... 345/174
(Continued)

FOREIGN PATENT DOCUMENTS

| CN | 102736809 A | 10/2012 |
| CN | 102903423 A | 1/2013 |
| EP | 2508967 A2 | 10/2012 |

OTHER PUBLICATIONS

Office action from corresponding Chinese Application No. 201310105112.9; dated Dec. 25, 2013; 5 pg.

*Primary Examiner* — Xiaoliang Chen
(74) *Attorney, Agent, or Firm* — Haynes Beffel & Wolfeld LLP; James F. Hann

(57) ABSTRACT

A capacitive transparent conductive film comprises: a transparent substrate, comprises a first surface and a second surface which is opposite to the first surface; a light-shield layer, formed at the edge of the first surface of the transparent substrate, the light-shield layer forms a non-visible region on the first surface of the transparent substrate; and a polymer layer, formed on the first surface of the transparent substrate, and covering the light-shield layer, the surface of the polymer layer is patterned to form a meshed trench, the trench is filled with conductive material to form a sensing region on the surface of the polymer layer. The capacitive transparent conductive film can effectively protect the conductive material and has low cost and good conductivity. A preparation method of the capacitive transparent conductive film is also provided.

18 Claims, 8 Drawing Sheets

(56) References Cited

U.S. PATENT DOCUMENTS

| | | | |
|---|---|---|---|
| 2011/0012841 A1* | 1/2011 | Lin | 345/173 |
| 2012/0118851 A1* | 5/2012 | Yang et al. | 216/13 |
| 2012/0187821 A1* | 7/2012 | Lee et al. | 313/498 |
| 2014/0131075 A1* | 5/2014 | Jang et al. | 174/255 |

\* cited by examiner

CAPACITIVE TRANSPARENT CONDUCTIVE FILM AND PREPARATION METHOD THEREOF

FIELD OF THE INVENTION

The present invention relates to a touch panel and a preparation method thereof, and more particularly relates to a capacitive transparent conductive film and preparation method thereof.

BACKGROUND OF THE INVENTION

A capacitive touch panel functions by utilizing an induced current of a human body, for example, when a finger touches the touch panel, the user and a surface of the capacitive touch panel form a coupling capacitor due to a body electric field, for a high frequency current, the capacitor is a conductor, a small current pass through from a contact point of the finger. The current flow out from electrodes located in four corners of the capacitive touch panel, and the current pass through the four electrodes is proportional to the distance between the finger and the four corner, the four current ratios are precisely calculated by a controller to get a position of the touch point.

OGS (One Glass Solution) will become a dominant technology of touch industry. Comparing with other touch panel solutions, OGS has three advantages: (1) a layer of glass is saved and an assembling cost is reduced; (2) the weight is reduced; (3) a transmittance is increased. OGS can better meet the need of thin of the intelligent terminal and enhance the display effect; it is an inevitable choice for high-end terminal.

The conventional OGS touch panel is to lay a layer of ITO on a surface of the cover glass, thus the glass plays a role of sensing and protection, an ITO bulges on the surface of the glass.

However, the conventional OGS conductive material is disposed on the surface of the glass, the ITO bulges on the surface, the conductive material is easy to be scratched, and thereby causing damage to the device, and it will not work properly. The main material of OGS is ITO, the main material of the ITO is a rare metal of indium, indium is rare, and the cost is high, the resistance of the large size OGS is high, the sensitivity is not good. In an embossing process of the visible region and non-visible region, the mesh density of the visible region and the non-visible region are different, the process (for example: demoulding, filling conductive material) will be different, thus there will be defective products in the trace region.

SUMMARY OF THE INVENTION

It is an object of the present invention to provide a capacitive transparent conductive film which can effectively protect the conductive material and has low cost and good conductivity.

A capacitive transparent conductive film, includes:
a transparent substrate, includes a first surface and a second surface opposite to the first surface;
a light-shield layer, formed at an edge of the first surface of the transparent substrate, the light-shield layer forms a non-visible region on the first surface of the transparent substrate; and
a polymer layer, formed on the first surface of the transparent substrate, and covering the light-shield layer, a surface of the polymer layer is patterned to form a meshed trench, the trench is filled with a conductive material to form a sensing area on a surface of the polymer layer.

According to one embodiment, the non-visible region of the capacitive transparent conductive film has traces, conductive materials of the traces are electrically connected to the conductive material in the trench, and the traces are attached to the surface of the polymer layer.

According to one embodiment, the conductive materials of the traces are directly connected to the conductive material in the trench.

According to one embodiment, the sensing region is provided with a line segment at an edge thereof electrically connected to the conductive material in the trench, the conductive materials of the traces are electrically connected to the conductive material in the trench by the line segment.

According to one embodiment, the traces are grid lines, the traces are electrically connected to the conductive material in the trench by a node.

According to one embodiment, the traces are formed on the non-visible region by screen printing or inkjet printing.

According to one embodiment, the traces are composed of patterned grids or line segments.

According to one embodiment, a line width of the patterned grid ranges from 2 μm to 50 μm, a height of the patterned grid ranges from 5 μm to 10 μm, a length of the patterned grid is less than 100 μm.

According to one embodiment, a width of the line segment ranges from 50 μm to 200 μm, a height of the line segment ranges from 5 μm to 10 μm.

According to one embodiment, a width of the light-shield layer ranges from 1 mm to 5 mm.

According to one embodiment, a width of the trench ranges from 1 μm to 5 μm, a depth of the trench ranges from 2 μm to 6 μm, and a depth to width ratio of the trench is greater than 1.

According to one embodiment, the sensing region is a visible region, the light transmittance of the visible region is greater than 89%.

According to one embodiment, a cell of the grid is a regular polygon, a ratio of an area of each cell covered by conductive material to a total area of each cell is less than 5%.

According to one embodiment, the capacitive transparent conductive film further includes a transparent protective layer, the transparent protective layer covers the surface of the polymer layer except for an output end of the trace region.

According to one embodiment, the polymer layer is made of a material selected from a group consisting of UV curable adhesive, polyethylene terephthalate, polycarbonate and polymethyl methacrylate.

According to one embodiment, the transparent substrate is a transparent glass plate.

According to one embodiment, the conductive material is selected from a group consisting of metal, indium tin oxide, transparent polymer materials, graphene, carbon nanotubes.

Compared to a conventional capacitive transparent conductive film, the capacitive transparent conductive film has at least the following advantages:

(1) The polymer layer of the capacitive transparent conductive film forms the trench for receiving the conductive material, and the conductive material is embedded in the polymer layer, thus the conductive material is effectively protected.

(2) The conductive material of the capacitive transparent conductive film is distributed in the polymer layer in a grid form, and the conductive material can be lower cost material, no ITO film is needed to coat the entire surface, so the cost of the capacitive transparent conductive film is lower compared to the conventional capacitive transparent conductive film.

(3) The conductive material of the capacitive transparent conductive film is uniformly distributed in a grid form, its resistance is small, the conductivity is good.

Furthermore, a method of preparing a capacitive transparent conductive film is provided.

A preparation method of a capacitive transparent conductive film, comprising the following steps:

forming the light-shield layer at an edge of the first surface of the transparent substrate to form the non-visible region;

coating the first surface of the transparent substrate to form the polymer layer, patterning the polymer layer to form the trench, the filling the trench with a conductive material to form the sensing region; and printing the traces at an edge of the sensing region of the surface of the polymer layer, and electrically connecting the traces to the conductive material in the trench.

DETAILED DESCRIPTION OF THE EMBODIMENTS

Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

Figure 1:
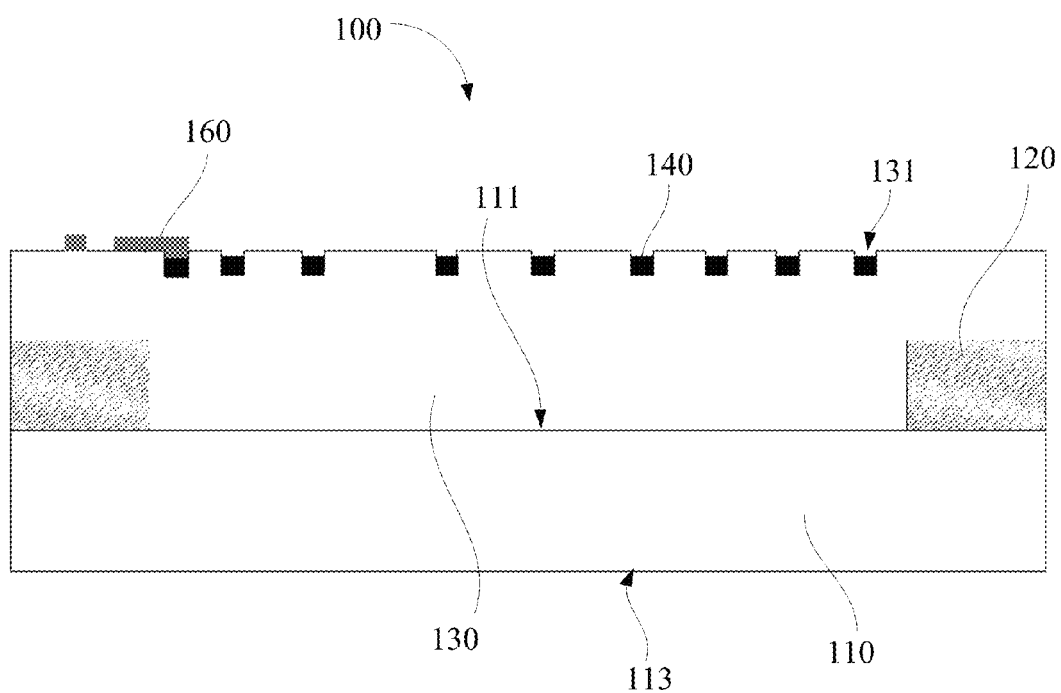
FIG. 1 is a schematic view of a capacitive transparent conductive film in accordance with one embodiment.
Figure 5:
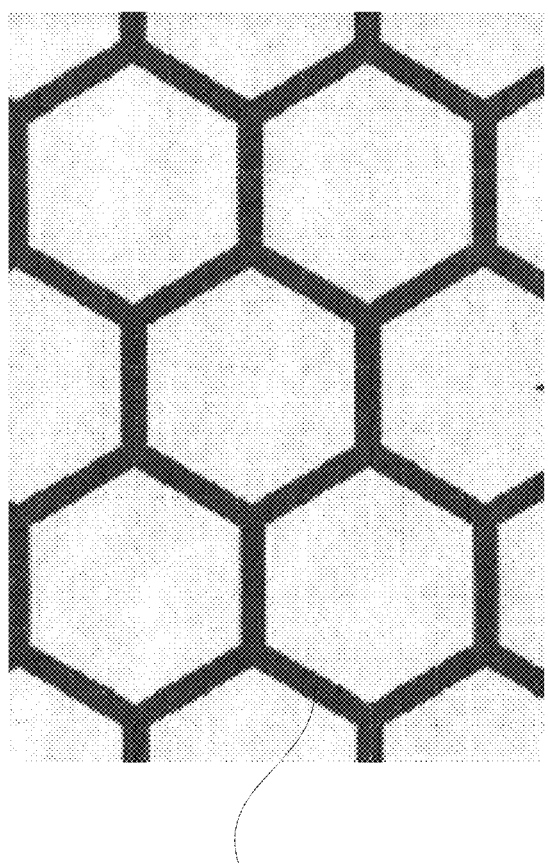
FIG. 5 is a partial schematic view of the trench of FIG. 2.
Figure 6:
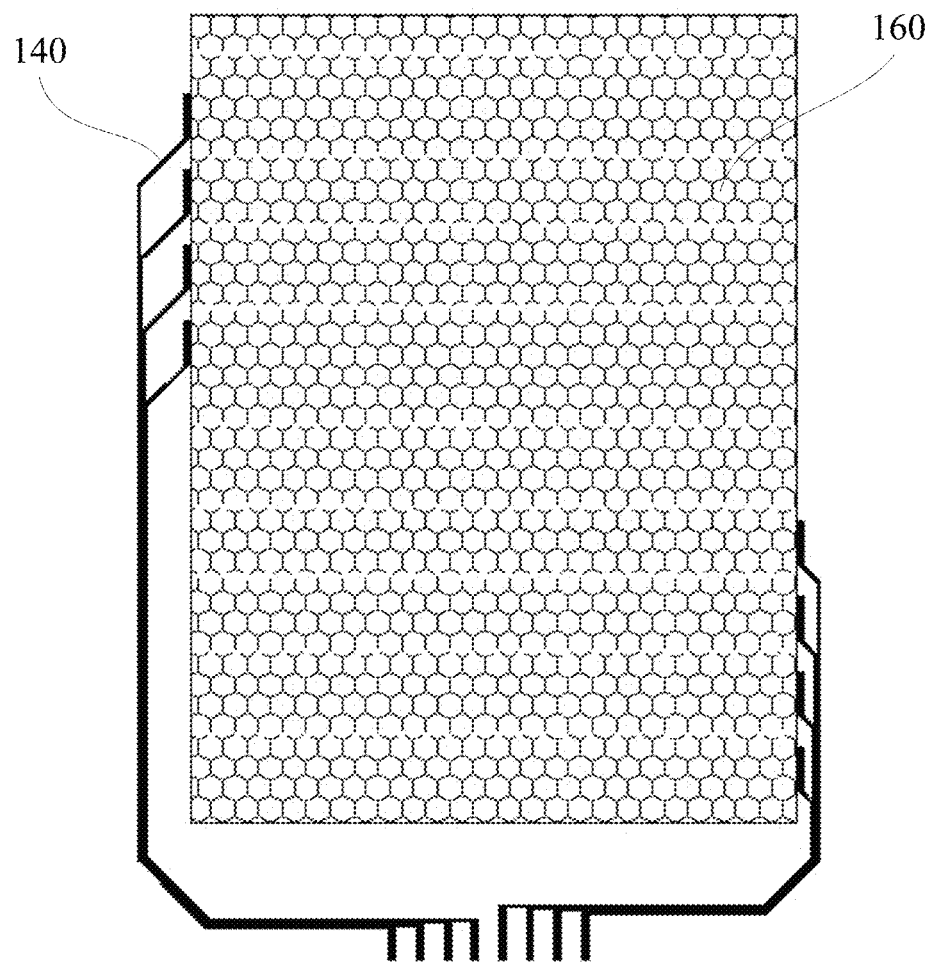
FIG. 6 is a top view of the capacitive transparent conductive film of FIG. 1.

Referring to FIG. 1, FIG. 5 and FIG. 6, an embodiment of a capacitive transparent conductive film 100 includes a transparent substrate 110, a light-shield layer 120, and a polymer layer 130. The transparent substrate 110 is used as a support of the capacitive transparent conductive film 100, the light-shield layer 120 is configured to form a non-visible region of the capacitive transparent conductive film 100, the polymer layer 130 is configured to form a conductive layer of the capacitive transparent conductive film 100.

The transparent substrate 110 includes a first surface 111 and a second surface 113 opposite to the first surface 111. The transparent substrate 110 can be a transparent glass plate or a transparent plate made of other material.

The light-shield layer 120 is formed at an edge of the first surface 111 of the transparent substrate 110, the light-shield layer forms a non-visible region on the first surface 111 of the transparent substrate 110. For example, the light-shield layer 120 can be formed on the first surface 111 of the transparent substrate 110 by coating. Preferably, a width of the light-shield layer 120 ranges from 1 mm to 5 mm.

Figure 2:
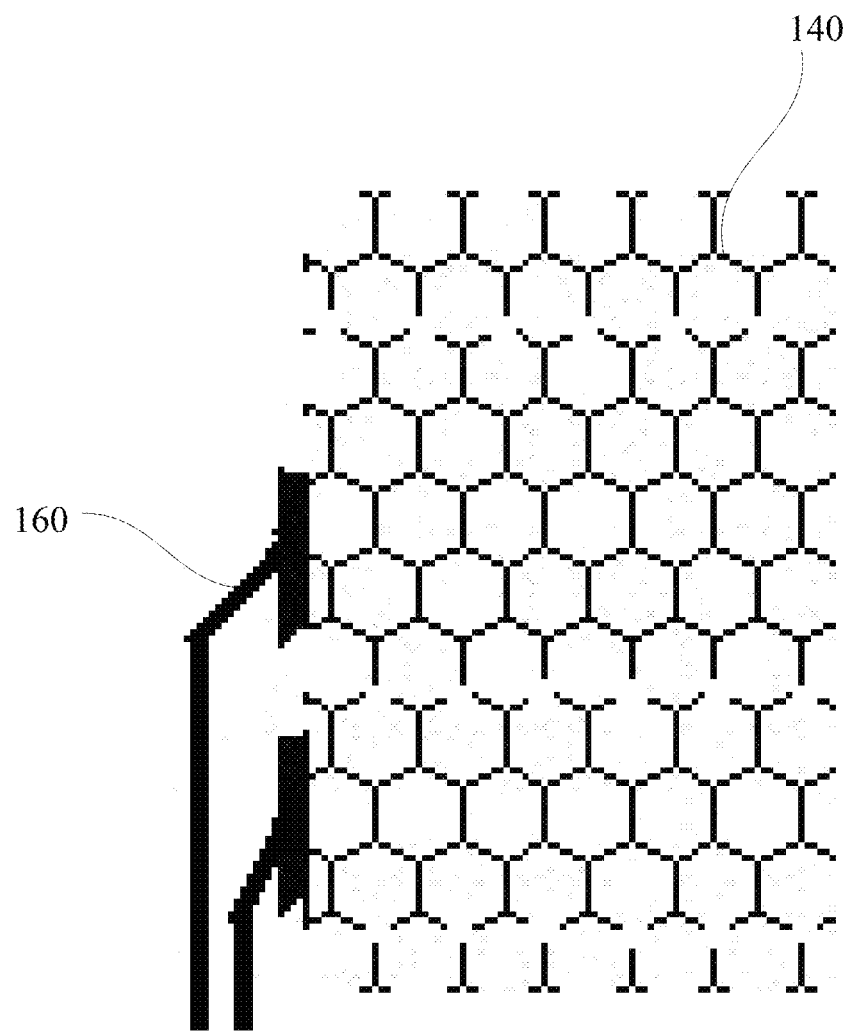
FIG. 2 is a schematic view of a meshed trench of the capacitive transparent conductive film of FIG. 1.
Figure 3:
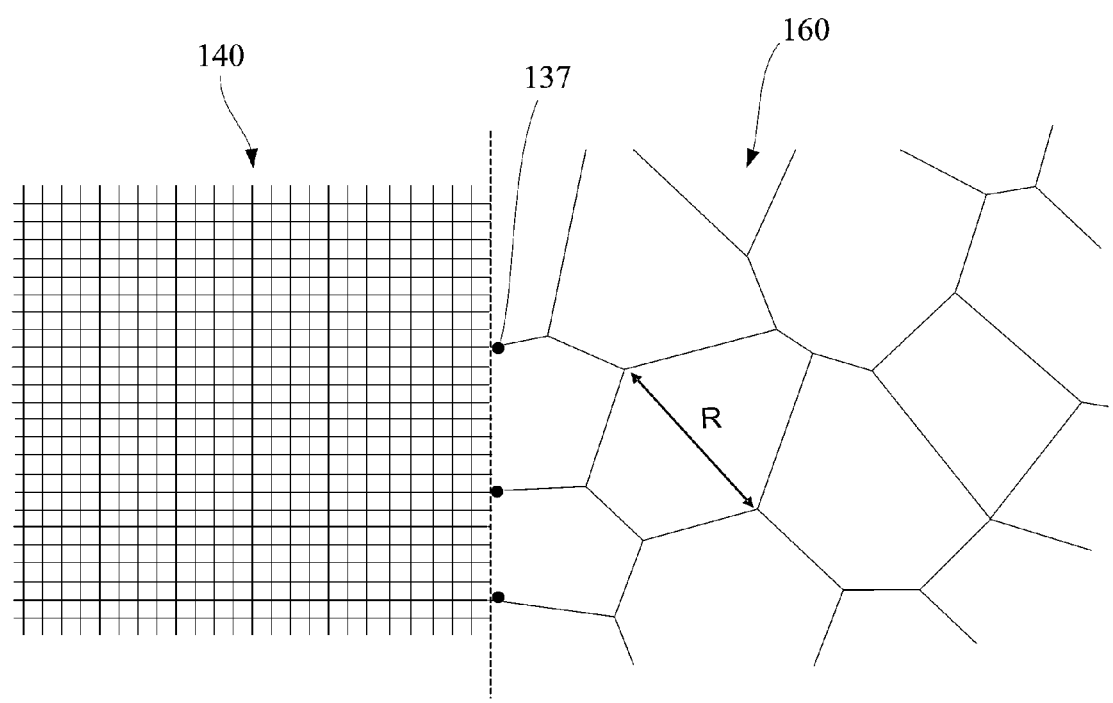
FIG. 3 is a schematic view of traces of the capacitive transparent conductive film in FIG. 1 in accordance with another embodiment.

Referring to FIG. 2 and FIG. 3, the polymer layer 130 is formed on the first surface 111 of the transparent substrate 110, and covers the light-shield layer 120. A surface of the polymer layer 130 is patterned to form a meshed trench 131, the trench 131 is filled with conductive material 140 to form a sensing region on a surface of the of the polymer layer 130. For example, the polymer layer 130 can be an ultraviolet curable adhesive layer (UV adhesive layer), which can be coated on the first surface 111 of the transparent substrate 110 by direct coating, and it is cured by ultraviolet irradiation.

Preferably, a width of the trench 131 ranges from 1 µm to 5 µm, a depth of the trench 131 ranges from 2 µm to 6 µm, and a depth to width ratio of the trench 131 is greater than 1. The sensing region is a non-visible region, and the transmittance of the visible region is greater than 89%.

It is to be noted that a cell of the grid is shaped as a regular polygon or other regular shapes. In the illustrated embodiment, the cell of the grid is shaped as a regular polygon, a ratio of the area of each cell covered by conductive material to a total area of each cell is less than 5%. In other words, the side length of the regular polygon is a, the line width is b, an area covered by the metal is a*b; an area of the regular polygon is $nr^2\tan(\alpha/2)$, where n is a number of sides, r is a radius of inscribed circle, α is a central angle of the side, a ratio of two areas is less than 5%.

Moreover, the conductive material is one selected from a group consisting of metal, indium tin oxide, transparent polymer materials, graphene, carbon nanotubes.

Referring to FIG. 1 again, the edge of the polymer layer 130 further forms a trace region corresponded to the non-visible region. Preferably, widths of traces 160 of the trace region range from 50 µm to 200 µm, heights of the traces 160 range from 5 µm to 10 µm.

The conductive materials of the traces 160 are electrically connected to the conductive material in the trench 131, and the traces 160 are attached to a surface of the light-shield layer 120. The conductive materials (not shown) of the traces 160 are directly or indirectly connected to the conductive material 141 in the trench 131. For example, the sensing region is provided with a line segment 135 at an edge thereof electrically connected to the conductive material 140 in the trench 131, the conductive materials of the traces 160 are electrically connected to the conductive material in the trench 131 by the line segment 135. Alternatively, the traces 160 are grid lines, and the traces 160 are electrically connected to the conductive material 140 in the trench 131 by a node 137.

Furthermore, the traces 160 are formed on the non-visible region by screen printing or inkjet printing.

Figure 4:
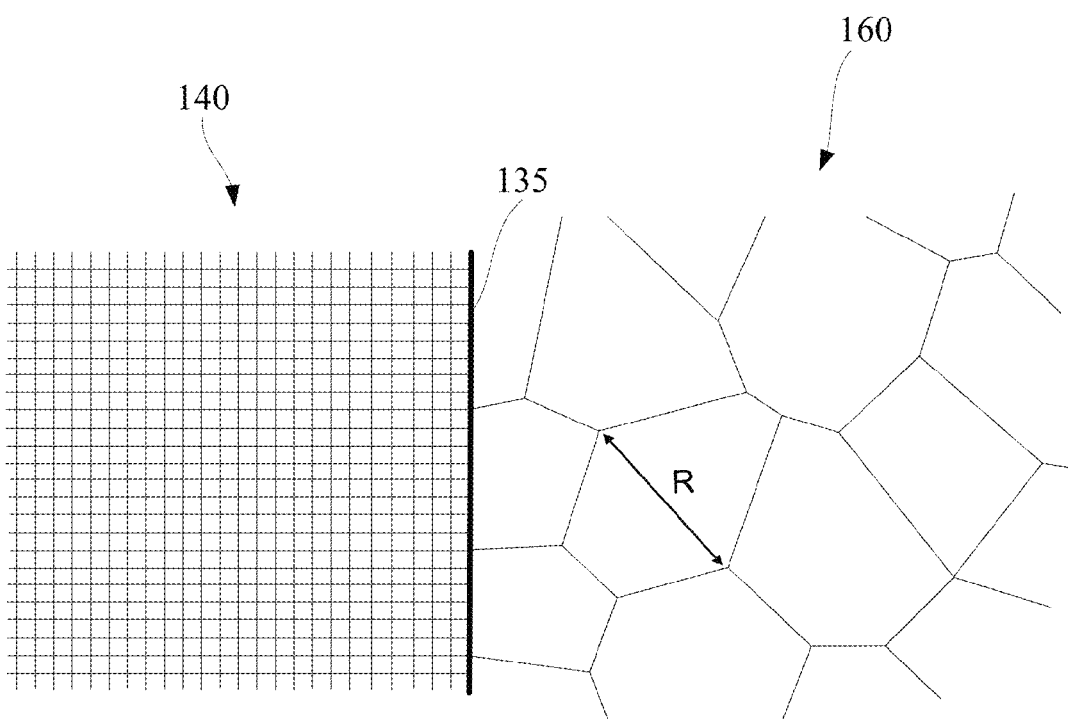
FIG. 4 is a schematic view of traces of the capacitive transparent conductive film in FIG. 1 in accordance with yet another embodiment.

Referring to FIG. 3 and FIG. 4, furthermore, the traces 160 can be patterned grids or be composed of line segments. A width of the patterned grid line ranges from 4 μm to 5 μm, a height of the patterned grid line ranges from 5 μm to 10 μm, a side length of the patterned grid is less than 100 μm. A width of the line segment ranges from 50 μm to 200 μm, a height of the line segment ranges from 5 μm to 10 μm.

Figure 7:
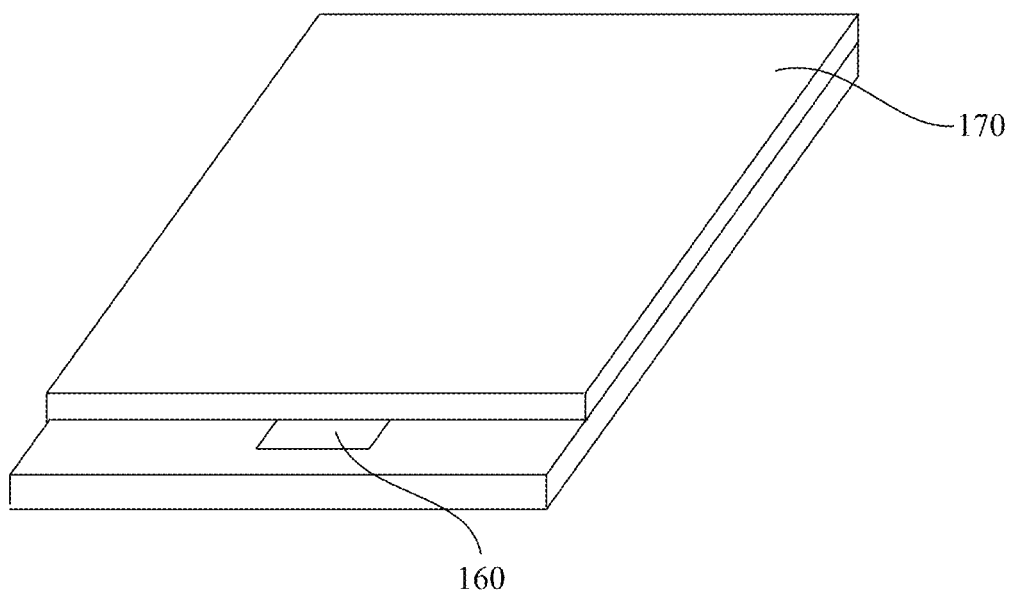
FIG. 7 is a schematic perspective view of the capacitive transparent conductive film of FIG. 1 in accordance with another embodiment.

Referring to FIG. 7, the capacitive transparent conductive film 100 further includes a transparent protective layer 170, the transparent protective layer 170 covers a surface of the polymer layer except for output ends of the traces 160 of the trace region.

Compared to a conventional capacitive transparent conductive film, the capacitive transparent conductive film 100 has at least the following advantages:

(1) The polymer layer 130 of the capacitive transparent conductive film 100 forms the trench 131 for receiving the conductive material 140, and the conductive material 140 is embedded in the polymer layer 130, thus the conductive material 140 is effectively protected.

(2) The conductive material 140 of the capacitive transparent conductive film 100 is distributed in the polymer layer 130 in a grid form, and the conductive material can use lower cost material, no ITO film is needed to lay the entire surface, so the cost of the capacitive transparent conductive film 100 is lower compared to the conventional capacitive transparent conductive film.

(3) The conductive material 140 of the capacitive transparent conductive film 100 is uniformly distributed in a grid form, its resistance is small, its conductivity is good.

Besides, a method of preparing a capacitive transparent conductive film is provided to prepare the capacitive transparent conductive film 100.

Figure 8:
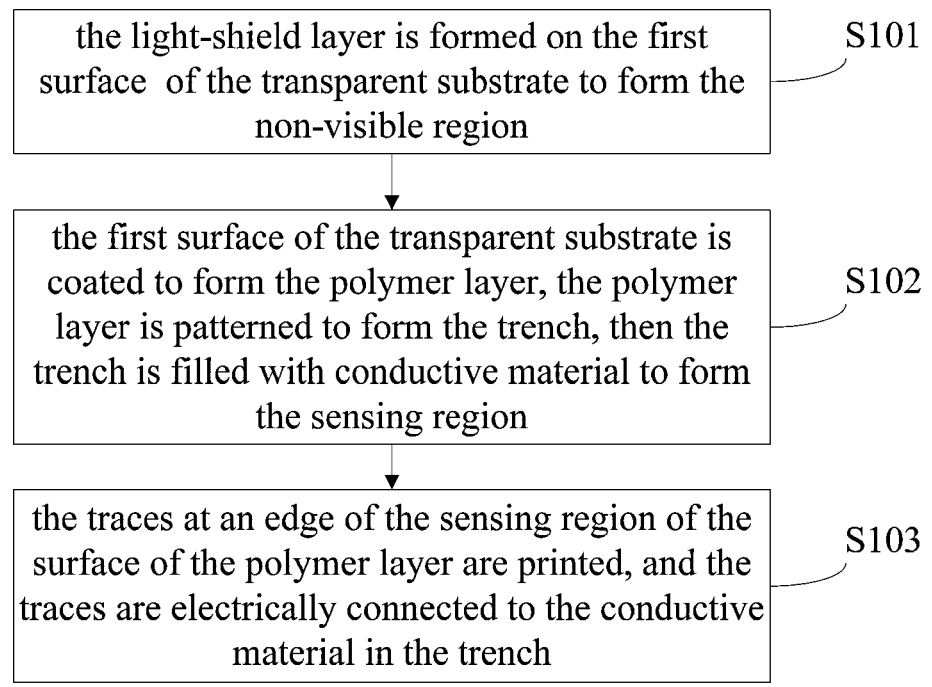
FIG. 8 is a flowchart of a method of preparing a capacitive transparent conductive film in accordance with one embodiment.

Referring to FIG. 8, the method of preparing the capacitive transparent conductive film 100 includes the following steps:

Step 101, the light-shield layer 120 is formed on the first surface 111 of the transparent substrate 110 to form the non-visible region.

For example, an ink can be sprayed at an edge of the glass substrate to prepare the capacitive transparent conductive film 100.

Step S102, the first surface 111 of the transparent substrate 110 is coated to form the polymer layer 130, the polymer layer 130 is patterned to form the trench 131, then the trench 131 is filled with conductive material 140 to form the sensing region.

For example, the UV adhesive is coated on a surface of the glass substrate of step S101, the visible region is patterned to form the meshed trench 131, a width of the trench is from 1 μm to 5 μm, a depth is from 2 μm to 6 μm, and it satisfies that a depth to width ratio is greater than 1; the trench 131 is filled with the conductive material 140, such that the surface of the UV adhesive is patterned to form the sensing region.

Step S103, the traces 160 at an edge of the sensing region of a surface of the polymer layer 130 are printed, and the traces 160 are electrically connected to the conductive material 140 in the trench 131.

For example, the traces 160 are printed at an edge of the visible region by screen printing; the traces 160 are electrically connected to the conductive material 140 in the trench 131.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A capacitive transparent conductive film, comprising:
   a transparent substrate comprising a first surface and a second surface opposite to the first surface;
   a light-shield layer formed at an edge of the first surface of the transparent substrate, the light-shield layer forming a non-visible region on the first surface of the transparent substrate; and
   a polymer layer formed on the first surface of the transparent substrate and covering the light-shield layer, a surface of the polymer layer being patterned to form a meshed trench, the trench being filled with a conductive material to form a sensing region on a surface of the polymer layer.

2. The capacitive transparent conductive film according to claim 1, wherein the non-visible region of the capacitive transparent conductive film has traces, conductive materials of the traces are electrically connected to the conductive material in the trench, and the traces are attached to the surface of the polymer layer.

3. The capacitive transparent conductive film according to claim 2, wherein conductive materials of the traces are directly connected to the conductive material in the trench.

4. The capacitive transparent conductive film according to claim 2, wherein the sensing region is provided with a line segment at an edge thereof electrically connected to the conductive material in the trench, the conductive materials of the traces are electrically connected to the conductive material in the trench by the line segment.

5. The capacitive transparent conductive film according to claim 2, wherein the traces are grid lines, the traces are electrically connected to the conductive material in the trench by a node.

6. The capacitive transparent conductive film according to claim 2, wherein the traces are formed on the non-visible region by screen printing or inkjet printing.

7. The capacitive transparent conductive film according to claim 2, wherein the traces are composed of patterned grids or line segments.

8. The capacitive transparent conductive film according to claim 7, wherein a line width of the patterned grid ranges from 2 μm to 50 μm, a height of the patterned grid ranges from 5 μm to 10 μm, length of the patterned grid is less than 100 μm.

9. The capacitive transparent conductive film according to claim 7, wherein a width of the line segment ranges from 50 μm to 200 μm, a height of the line segment ranges from 5 μm to 10 μm.

10. The capacitive transparent conductive film according to claim 1, wherein a width of the light-shield layer ranges from 1 mm to 5 mm.

11. The capacitive transparent conductive film according to claim 1, wherein a width of the trench ranges from 1 μm to 5 μm, a depth of the trench ranges from 2 μm to 6 μm, and a depth to width ratio of the trench is greater than 1.

12. The capacitive transparent conductive film according to claim 1, wherein the sensing region is a visible region, a light transmittance of the visible region is greater than 89%.

13. The capacitive transparent conductive film according to claim 1, wherein a cell of the grid is a regular polygon, a ratio of the area of each cell covered by a conductive material to a total area of each cell is less than 5%.

14. The capacitive transparent conductive film according to claim 2, further comprising a transparent protective layer, wherein the transparent protective layer covers the surface of the polymer layer except for output ends of the trace region.

15. The capacitive transparent conductive film according to claim 1, wherein the polymer layer is made of a material selected from a group consisting of UV curable adhesive, polyethylene terephthalate, polycarbonate, and polymethyl methacrylate.

16. The capacitive transparent conductive film according to claim 1, wherein the transparent substrate is a transparent glass plate.

17. The capacitive transparent conductive film according to claim 1, wherein the conductive material is selected from a group consisting of metal, indium tin oxide, transparent polymer materials, graphene, and carbon nanotubes.

18. A method of preparing a capacitive transparent conductive film, comprising the following steps:
   forming the light-shield layer at an edge of the first surface of the transparent substrate to form the non-visible region;
   coating the first surface of the transparent substrate to form the polymer layer, patterning the polymer layer to form the trench, then filling the trench with a conductive material to form the sensing region; and
   printing the traces at an edge of the sensing region of the surface of the polymer layer, and electrically connecting the traces to the conductive material in the trench.

* * * * *